United States Patent [19]
Liu

[11] Patent Number: 5,698,461
[45] Date of Patent: Dec. 16, 1997

[54] METHOD FOR FABRICATING LIGHTLY DOPED DRAIN METAL OXIDE SEMICONDUCTOR FIELD EFFECT TRANSISTOR

[75] Inventor: Ming-Hua Liu, Tai-Chung, Taiwan

[73] Assignee: United Microelectronics Corp., Taiwan, Taiwan

[21] Appl. No.: 614,346

[22] Filed: Mar. 12, 1996

[51] Int. Cl.$^6$ ............................................. H01L 21/335
[52] U.S. Cl. ............................ 437/44; 437/27; 437/41
[58] Field of Search ........................... 437/44, 41 CS, 437/27

[56] References Cited

U.S. PATENT DOCUMENTS

| | | | |
|---|---|---|---|
| 5,175,119 | 12/1992 | Matsutani | 437/44 |
| 5,374,574 | 12/1994 | Kwon | 437/44 |
| 5,374,575 | 12/1994 | Kim et al. | 437/44 |
| 5,472,897 | 12/1995 | Hsu et al. | 437/44 |
| 5,484,743 | 1/1996 | Ko et al. | 437/44 |
| 5,538,913 | 7/1996 | Hong | 437/44 |

FOREIGN PATENT DOCUMENTS

| 1191478 | 8/1989 | Japan | 437/46 |
|---|---|---|---|

*Primary Examiner*—Chandra Chaudhari
*Assistant Examiner*—Toniae M. Thomas
*Attorney, Agent, or Firm*—Brumbaugh, Graves, Donohue & Raymond

[57] ABSTRACT

A lightly doped drain (LDD) metal oxide semiconductor field effect transistor (MOSFET). Field oxide is used as a hard mask for a total-overlap polysilicon (TOP) gate which minimizes hot-carrier degradation, so that a soft-mask step is saved. The field oxide is used also as a hard mask for surface counter-doping which reduces gate-induced drain leakage, and in making a punch-through stop which reduces drain-induced barrier low and short channel effect.

11 Claims, 5 Drawing Sheets

METHOD FOR FABRICATING LIGHTLY DOPED DRAIN METAL OXIDE SEMICONDUCTOR FIELD EFFECT TRANSISTOR

FIELD OF THE INVENTION

The present invention relates to a method for fabricating a metal oxide semiconductor field effect transistor (MOSFET) having a lightly doped drain (LDD) structure, and especially to a method for fabricating such an LDD MOSFET with a total-overlap polysilicon (TOP) gate.

BACKGROUND OF THE INVENTION

As device dimensions get smaller, and device density increases, it becomes more and more difficult to produce MOSFET elements reliably and efficiently. When MOSFET elements are scaled down, shortcomings arise such as hot carrier degradation, short channel effect, gate induced drain leakage and drain induced barrier low, for example. To minimize these shortcomings, a lightly doped drain structure has been included in sub-micrometer devices. However, forming such a structure has been complicated.

SUMMARY OF THE INVENTION

It is an object of the present invention to provide a method for fabricating an LDD MOSFET element with minimized shortcomings such as hot carrier degradation, short channel effect, gate induced drain leakage, and drain induced barrier low, for example.

It is a further object of the present invention to provide a method for fabricating an LDD MOSFET element which is simpler as compared with conventional LDD MOSFET processing.

In accordance with an aspect of the present invention, a total-overlap polysilicon gate is used to reduce hot carrier degradation. Surface counter-doping is used to reduce gate induced drain leakage. A punch-through stop is included to reduce drain induced barrier low and short channel effect. Silicon nitride ($Si_3N_4$) is used as a hard mask of the total-overlap polysilicon gate, so that a soft-mask step is saved as compared with conventional LDD MOSFET processing. The silicon nitride is also used as hard mask for surface counter-doping and in forming the punch-through stop. Planarization can be effected in the course of forming a spacer.

The objects of the present invention are realized when the following steps are used in forming an LDD MOSFET on a semiconductor substrate having first type conductivity: forming a silicon nitride shield on the substrate, forming field oxide on the substrate, coating a photoresist and defining a suitable opening or window on the shield, implanting first type impurities via the window through the silicon nitride shield into the substrate for surface counter-doping, anisotropically etching the shield using the photoresist as a mask to form an opening in the shield, removing the photoresist, implanting second type impurities using the shield and the field oxide as a mask to form a lightly doped source-and-drain region, depositing an oxide layer on the silicon nitride layer in the opening, anisotropically etching the oxide layer to form spacers on the sidewalls of the shield and to planarize the field oxide, implanting first type impurities using the spacers, the shield and the field oxide as a mask to form a punch-through stop, removing the spacers, forming gate oxide on the substrate in the opening, forming a total-overlap gate on the gate oxide in the opening, removing the shied, and implanting second type impurities using the total-overlap polysilicon gate and the field oxide as a mask to form heavily doped source and drain regions.

DETAILED DESCRIPTION OF A PREFERRED EMBODIMENT

This description is for a preferred embodiment of the invention using a P type semiconductor substrate for an LDD MOSFET.

Figure 1:
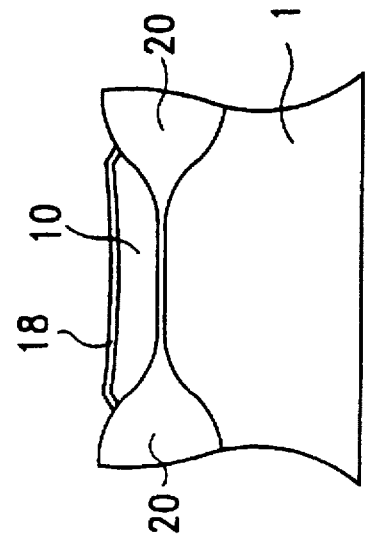
FIGS. 1–14 are cross sections of structures as sequentially formed in an exemplary method of the present invention.

FIG. 1 shows a P type substrate 1, and a deposited and etched silicon nitride shield 10 on an area of the substrate 1 where an active region will be formed.

Figure 2:
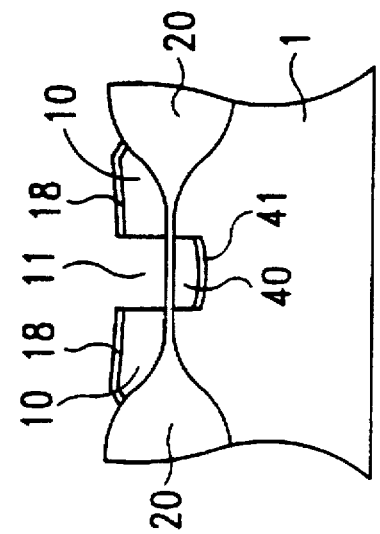

FIG. 2 further shows field oxide 20 formed by thermal oxidation adjacent to the shield 10 on the substrate 1, with a thickness in an approximate range from 5 to 7 K Å. The silicon nitride shield 10 now has a silicon nitride oxide surface layer 18.

Figure 3:
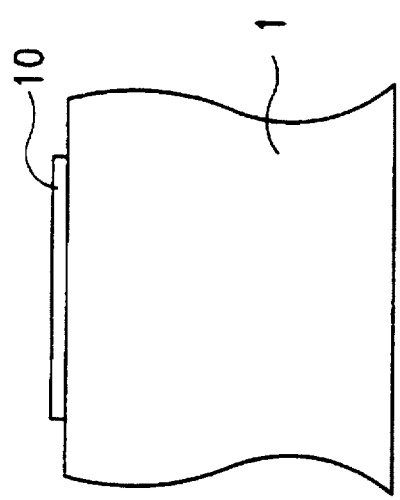

FIG. 3 further shows a photoresist layer 30 coated onto the field oxide 20 and the silicon nitride shield 10, and photolithographically defined to form a first opening 31. Via the first opening 31, P type impurities are implanted through the silicon nitride shield 10 into the substrate 1 to form surface counter dope 40. For example, B11 impurities can be implanted with a dose between 1E11 and 5E11/cm$^2$ and a kinetic energy between 20 and 40 KeV.

Figure 4:
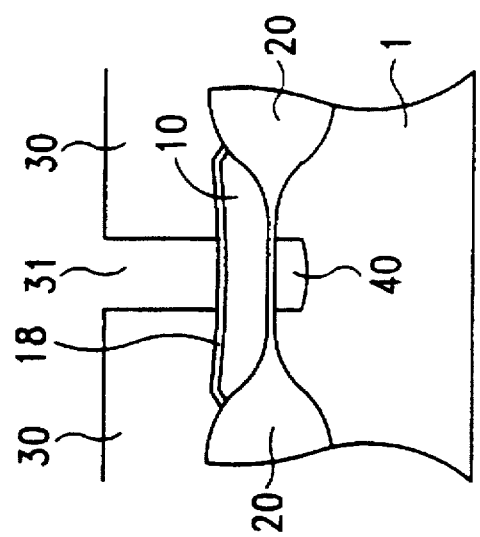

FIG. 4 further shows the shield 10 with an anisotropically etched second opening 11 over the surface counter dope, e.g. formed by reactive ion etching, using the photoresist layer 30 as a mask. After removal of the photoresist layer 30, N type impurities are implanted into the substrate 1 to form a lightly doped N⁻source-and-drain region 41 under the surface counter dope 40, using the shield 10 and the field oxide 20 as mask. For example, P31 impurities can be implanted with a dose between 1E13 and 8E13/cm$^2$ and a kinetic energy between 30 and 80 KeV.

Figure 5:
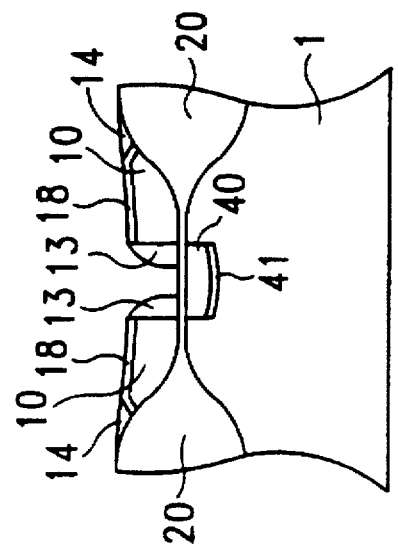

FIG. 5 further shows an oxide layer 12 deposited on the shield 10, the field oxide 20, and in the second opening 11. For example, chemical vapor deposition can be used to deposit the oxide layer 12 with a thickness between 1 and 2 K Å.

Figure 6:
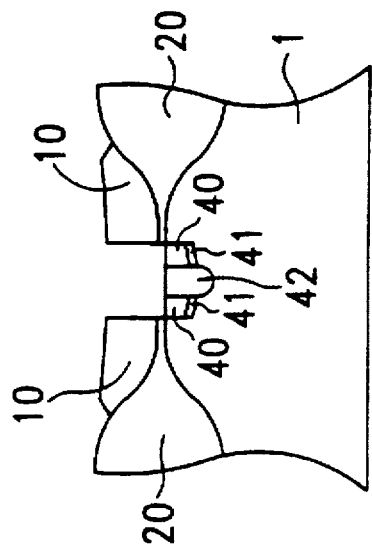

FIG. 6 further shows the oxide layer 12 etched by an anisotropic etching technique, e.g. reactive ion etching leaving spacers 13 on the side walls of the second opening 11. Remaining also are fillers 14, resulting in simultaneous planarization.

Figure 7:
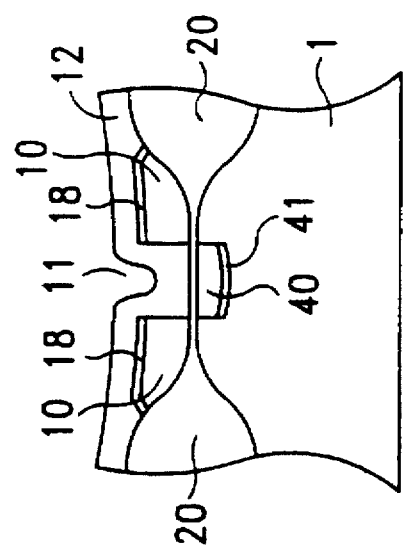

FIG. 7 further shows the punch-through stop 42 which was formed using the spacers 13, the shield 10 and the field oxide 20 as a mask, by implanting P type impurities into the substrate 1. This also separates the N⁻source and drain regions 41. For example, B11 can be implanted with a dose between 5E13 and 5E14/cm$^2$ and a kinetic energy between 40 and 80 KeV. Instead of boron ions, $BF_2$ ions can be implanted, with a dose between 1E13 and 8E13/cm$^2$ and a kinetic energy between 30 and 80 KeV.

Figure 8:
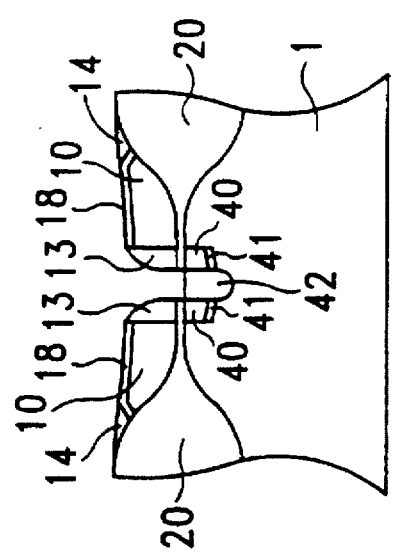

FIG. 8 further shows the spacers 13 and fillers 14 removed, e.g. by selective wet etching.

Figure 9:
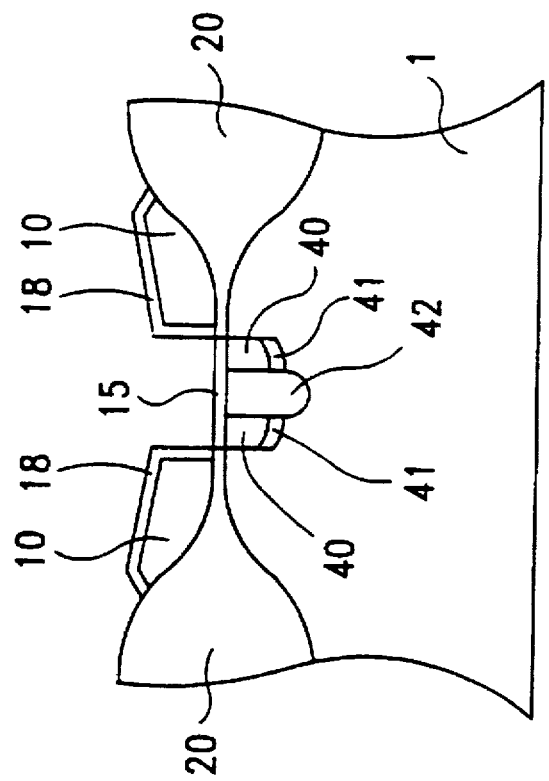

FIG. 9 further shows the result of thermal oxidation, namely gate oxide 15 in the opening of the shield 10, and silicon nitride oxide 18 on the shield 10.

Figure 10:
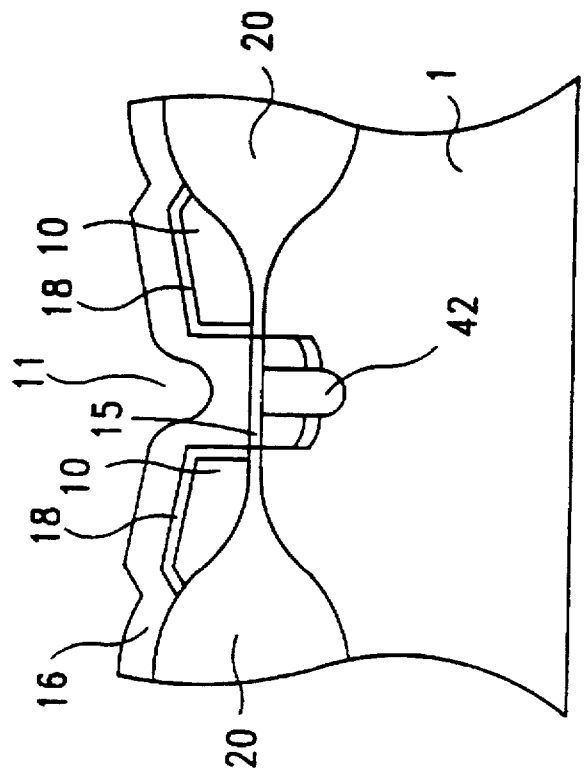
Figure 12:
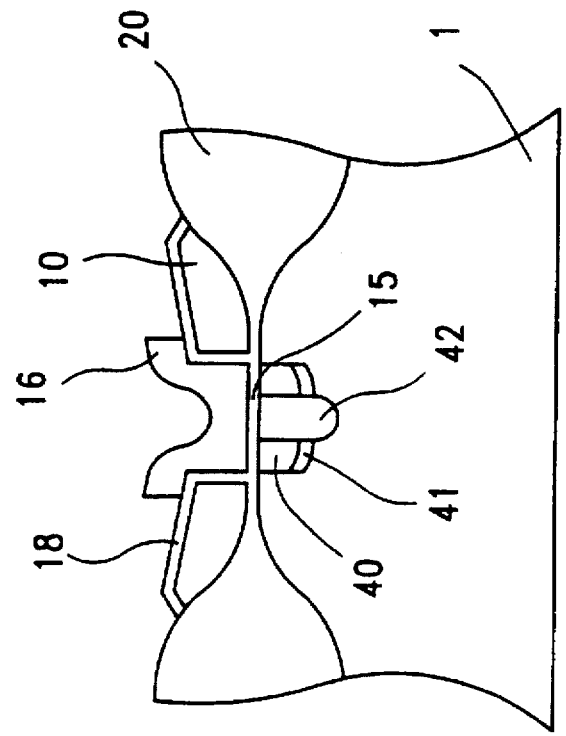
Figure 11:
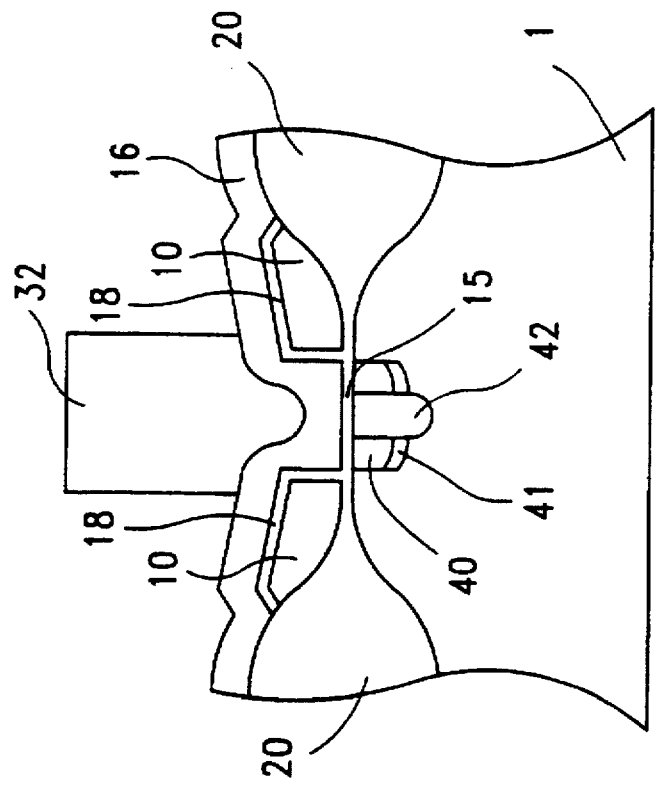

FIGS. 10–12 further show how a total-overlap polysilicon gate is formed in the second opening 11. For example, a polysilicon layer with a thickness between 1 K Å and 3 K Å is deposited on the field oxide 20, the silicon nitride oxide 18 and the gate oxide 15, with N type impurities for improved conductivity. Then, a photoresist layer 32 is coated and defined on the polysilicon layer 16, and, using the photoresist layer 32 as a mask, the polysilicon layer 16 is etched to form the total-overlap polysilicon gate 16. A tungsten silicate layer can be deposited on the polysilicon layer 16 for improved conductivity.

Figure 13:
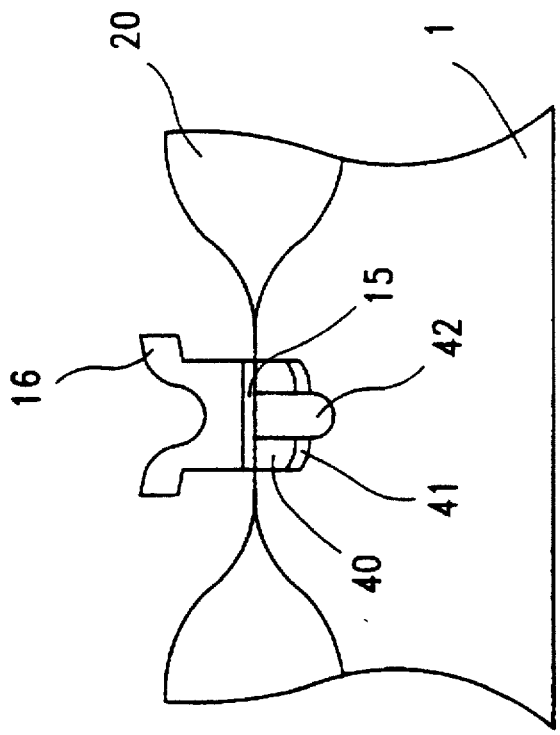

FIG. 13 further shows the shield 10 removed. For example, the silicon nitride oxide 18 is removed by etching, and then the shield 10 is removed using hot phosphoric acid ($H_3PO_4$).

Figure 14:
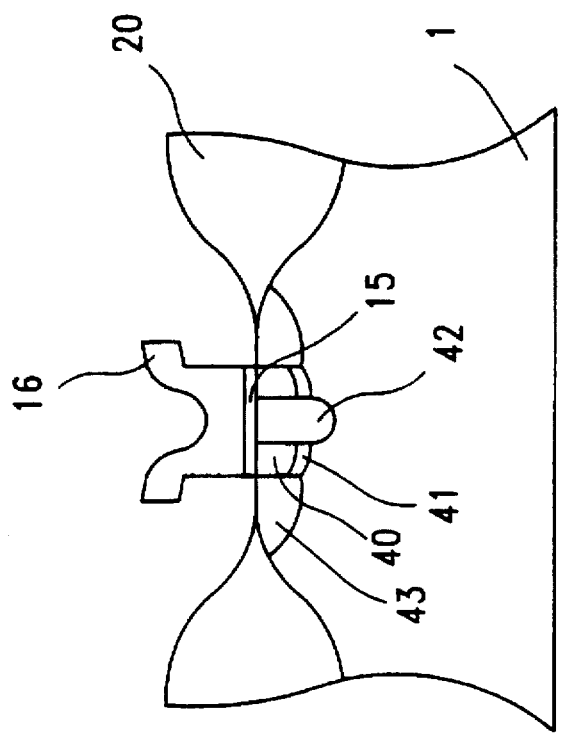

FIG. 14 further shows heavily doped $N^+$ source and drain regions 43 adjacent to the surface counter dope 40 and the lightly doped source/drain regions 41, formed by using the total-overlap polysilicon gate 16 and the field oxide 20 as a mask in implanting N type impurities into the substrate 1. Subsequent processing including passivation and metallization is the same as in conventional LDD MOSFET processing.

The present invention can be applied to P or N type substrates, by an interchange which is well known by those skilled in the art.

The present invention is not limited to the exemplary embodiments which have been described, as various modifications and similar structures are included within the spirit and scope of the appended claims.

What is claimed is:

1. A method for making an LDD MOSFET structure at a major surface of a semiconductor substrate having a first conductivity type, comprising:

forming a silicon nitride shield on a portion of the major surface;

forming field oxide on the substrate, adjacent to the shield;

coating a photoresist onto the shield and the field oxide, and defining a window in the photoresist on the shield;

implanting first impurities, of the first conductivity type, into the substrate using the photoresist as a mask to form a surface counter dope;

anisotropically etching the shield using the photoresist as a mask to form an opening in the shield over the surface counter dope;

removing the photoresist;

implanting second impurities, of the second conductivity type, into the substrate using the shield and the field oxide as a mask to form a lightly doped source-and-drain region under the surface counter dope;

depositing an oxide layer on the field oxide and the shield and in the opening in the shield;

anisotropically etching the oxide layer to form spacers on the sidewalls of the opening in the shield;

implanting third impurities, of the first conductivity type, into the substrate using the spacers, the shield and the field oxide as a mask to a form a punch-through stop and to separate the source-and-drain region into a source region and a drain region;

removing the spacers;

forming a gate oxide layer on the surface counter dope and the punch-through stop, thereby further forming a silicon nitride oxide layer on the shield;

forming a total-overlap gate on the gate oxide layer;

removing the silicon nitride oxide layer and the shield; and implanting fourth impurities, of the second conductivity type, into the substrate using the total-overlap gate and the field oxide as a mask to form heavily doped source and drain regions adjacent to the lightly doped source and drain regions.

2. The method according to claim 1, wherein depositing the oxide layer comprises using chemical vapor deposition to a thickness between 1 and 2 K Å.

3. The method according to claim 1, wherein forming the total-overlap gate comprises:

forming a polysilicon layer on the gate oxide layer;

implanting N type impurities into the polysilicon layer to improve conductivity in the polysilicon layer;

coating and defining a further photoresist layer on the polysilicon layer;

etching the polysilicon layer using the defined further photoresist layer as a mask to form the total-overlap polysilicon gate.

4. The method according to claim 3, wherein the polysilicon layer has a thickness between 1 and 3 K Å.

5. The method according to claim 3, further comprising depositing a tungsten silicate layer on the polysilicon layer.

6. The method according to claim 1, wherein removing the silicon nitride oxide layer and the shield comprises etching the silicon nitride oxide layer and using hot phosphoric acid to remove the shield.

7. The method according to claim 1, wherein the first conductivity type is N type.

8. The method according to claim 1, wherein the first conductivity type is P type.

9. The method according to claim 8, wherein the first impurities comprise B11, implant energy is between 20 and 40 KeV, and dose is between 1E11 and 5E11/cm$^2$.

10. The method according to claim 8, wherein the second impurities comprise P31, the implant energy is between 30 and 80 KeV, and the dose is between 1E13 and 8E13/cm$^2$.

11. The method according to claim 8, wherein the third impurities comprise $BF_2$, the implant energy is between 30 and 80 KeV, and the dose is between 1E13 and 8E13/cm$^2$.

* * * * *